(12) United States Patent
Stiblert et al.

(10) Patent No.: US 6,948,254 B2
(45) Date of Patent: Sep. 27, 2005

(54) METHOD FOR CALIBRATION OF A METROLOGY STAGE

(75) Inventors: Lars Stiblert, Gothenburg (SE); Peter Ekberg, Lidingo (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 10/692,861

(22) Filed: Oct. 27, 2003

(65) Prior Publication Data

US 2005/0086820 A1 Apr. 28, 2005

(51) Int. Cl.[7] ................................................. G01B 1/00
(52) U.S. Cl. ........................... 33/502; 33/1 M; 73/1.79
(58) Field of Search ......................... 33/502, 1 M, 549, 33/551, 554, 568, 573; 73/1.79

(56) References Cited

U.S. PATENT DOCUMENTS

| | | | |
|---|---|---|---|
| 4,583,298 A | | 4/1986 | Raugh |
| 5,798,947 A | | 8/1998 | Ye et al. |
| 5,960,185 A | * | 9/1999 | Nguyen ........................ 716/9 |
| 6,174,788 B1 | * | 1/2001 | Balamurugan ............... 438/460 |
| 6,317,991 B1 | * | 11/2001 | Rinn ............................ 33/1 M |
| 6,366,866 B1 | * | 4/2002 | Kanagawa et al. ........... 702/95 |
| 6,463,667 B1 | * | 10/2002 | Ushio et al. .................. 33/502 |
| 6,493,956 B1 | * | 12/2002 | Matsuda ....................... 33/502 |
| 6,535,781 B1 | * | 3/2003 | Tsutsumi .................... 700/121 |
| 6,594,532 B2 | * | 7/2003 | Mills ........................... 700/56 |
| 6,601,311 B2 | * | 8/2003 | McMurtry et al. ............ 33/502 |
| 6,601,434 B2 | * | 8/2003 | Schaefer ..................... 73/1.79 |
| 6,781,694 B2 | * | 8/2004 | Nahum et al. ............... 356/420 |

* cited by examiner

Primary Examiner—Christopher W. Fulton
Assistant Examiner—Amy R. Cohen
(74) Attorney, Agent, or Firm—Harness, Dickey & Pierce, P.L.C.

(57) ABSTRACT

The present invention relates to a method for calibrating a metrology stage in at least two dimensions using an artefact plate having marks forming a pattern, comprising the steps of: placing the artefact plate on the metrology stage in at least three positions, assuming the geometrical properties of the metrology stage and the artefact plate, and the positions of the artefact plate for each measurement, forming a model predicting the measurements of the artefact plate, measuring the marks by the metrology stage, and inverting said model to improve the assumptions on metrology stage and artefact plate.

15 Claims, 3 Drawing Sheets

METHOD FOR CALIBRATION OF A METROLOGY STAGE

TECHNICAL FIELD

The present invention relates to a method for calibration of a metrology stage in a measuring apparatus, preferably a pattern generating apparatus, as defined in claim 1 and claim 5.

BACKGROUND TO THE INVENTION

Two-dimensional (2D) coordinate stages are used in many stages of very-large-scale-integrated (VLSI) circuit fabrication, to position lithography masks and move wafers to predetermined positions with high degree of reproducibility and accuracy. Typical tools which incorporate 2D-coordinate stages include electron and laser beam pattern generators in mask making, optical steppers in wafer printing and placement inspection tools in mask metrology.

In conventional photolithographic processing of semiconductor wafers, a plurality of masks is used in sequence to define microelectronic structures and features therein. Of course, in order to ensure that the features produced with a first mask are properly aligned to features produced with a second mask during a subsequent process step, it is typically necessary that the two masks be properly aligned relative to each other and that the mask patterns used to define the features be accurately located on each mask. In the past, the mask making industry faced little technical challenge in meeting the alignment and accuracy challenges posed by semiconductor process designers, even as critical photolithographic linewidths decreased by a factor of ten (10). The ability to meet these early challenges was due, at least in part, to high resolution and placement accuracy provided by mask pattern generators and the transition in wafer exposure tools from predominantly 1×optical lithography to 5×reduction optical lithography. However, as critical photolithographic linewidth feature sizes continue to shrink, improved techniques and equipment for meeting more precise alignment and accuracy challenges are required.

During fabrication of integrated circuits, a semiconductor wafer is typically mounted on a 2D-coordinate stage. Typically, the (u,v) position and movement of the stage is monitored by a laser-interferometer. As will be understood by those skilled in the art, the measured (u,v) position of the stage will most often contain a deviation from the actual position of the stage in Cartesian coordinates. This deviation is typically referred to as the stage position measurement error. The Cartesian coordinate system has straight and uniform (x,y) grid lines which are orthogonal and have the same scale. As will be understood by those skilled in the art, the stage position measurement error is the sum of (i) random measurement noise (which can be caused by noise in circuitry, mechanical vibration, and air movement, etc.) and (ii) systematic measurement error (which is a function of the stage position, and can arise from, for example, the non-orthogonality between the x-y mirrors, curvature of the mirrors, etc.). The systematic measurement error is also called stage distortion. Accordingly, a proper calibration of 2D-coordinate stages generally requires the determination of the stage distortion by mapping the measured stage position to its respective position in the Cartesian coordinate grid.

Most stand-alone apparatus that have 2D-coordinate stages for VLSI processing and testing constitute a 2D-coordinate metrology system (e.g. mask placement inspection tools) or have 2D-metrology capability (e.g. electron-beam pattern generators and optical steppers). When using these apparatus, stage distortion typically manifests itself as a coordinate measurement error when measuring marks having known positions on a rigid artefact plate ("standard plate").

The measurement of marks on a standard plate is a form of conventional calibration typically requiring two steps. The first step measures a standard plate having mark positions that are known to a higher degree of precision than the stage grid. The second step determines a mapping function (stage calibration function) between the measured coordinates and the actual coordinates, using a piece-wise linear function or polynomial fitting, as an approximation to the actual stage distortion.

Unfortunately, the use of standard plates to calibrate 2D metrology stages is no longer generally feasible because it is difficult to fabricate plates with mark positions at locations known with higher levels of accuracy than the levels obtainable with state-of-the-art metrology tools. To address this fundamental problem, self-calibration techniques have been developed to calibrate metrology stages using artefact plates with an array of mark positions having locations that are not precisely known. The only requirement is that the artefact plate is "rigid" so that the relative positions of the marks on the plate do not change when the plate is rotated or translated on the stage.

In U.S. Pat. No. 4,583,298 to Raugh, conventional self-calibration techniques are disclosed. Some conditions for achieving complete self-calibration were pointed out:

1) There must be at least three different measurement views including rotational displacement of the plate and a translational displacement (or another rotation about a different pivoting point) of the plate.

2) The pivoting points must be at different stage positions.

3) The lattice generated by the initial pivoting point pair must be dense.

However, the algorithm proposed was computationally expensive because it was non-linear and possible unstable in the presence of large random measurement noise.

An improved method for performing complete self-calibration of metrology stages was disclosed in U.S. Pat. No. 5,798,947 to Ye et al., by mapping each of a two-dimensional array of stage positions (u,v) to a corresponding position in a Cartesian coordinate grid (x,y) to determine the distortion there between. This mapping function is performed by a series of operations which use an orthogonal Fourier series to decouple the determination of a distortion function. A disadvantage with the method is that a rigid artefact plate having a two-dimensional N×N array of marks thereon, having a predetermined interval, has to be provided when making the measurements. Another disadvantage is that the rotation has to be ±90° and the translation has to be at least one interval.

SUMMARY OF THE INVENTION

An object of the invention is to provide a method for self calibration of a metrology stage where a non-rigid plate can be used when calibrating the metrology stage.

A further object with the invention is that a plate may be used where the position of the marks are not known in advance, i.e. arbitrarily scattered across the surface of the plate.

A solution to these objects is achieved by using a method as defined in claim 1 and claim 5.

An advantage with the present invention is that the calibration of a stage may be performed that enhances the possibility to align two or more masks to each other during semiconductor manufacture, especially for very small line widths.

Further aspects and advantages are obvious from the description of the preferred embodiments.

DETAILED DESCRIPTION OF PREFERRED EMBODIMENTS

The principal that the method according to the invention is based upon makes it possible to use a calibration plate which is provided with a number of marks arbitrarily scattered across the surface of the plate. A plate provided with N×N arrays of marks in a grid structure may naturally also be used. The method will provide a possibility to determine the stage distortion function S (x,y) and also the plate distortion function P (x,y) provided at least three different measurement views has been measured including transitional movement and rotational movement as illustrated in connection with examples below.

The errors between measured positions $(u_i, v_i)$ and the Cartesian coordinates $(x_i, y_i)$ for each measurement point i is a result of errors in the plate and/or errors in the stage. Normally both the plate and the stage contribute to the error in measurement.

The self-calibration is generally performed in the following steps:

1. A calibration plate with marks arbitrarily scattered across the surface is provided.

2. An apparatus having means to measure the position of the marks is used, but the stage of the apparatus is not perfect and a correction needs to be done.

3. The calibration plate is arbitrarily placed on the stage to establish different measurement views.

The knowledge of the appearance of the stage is rather good and the knowledge of the appearance of the calibration plate is rather good, but "rather good" is not good enough for determining the distortion function for the stage and/or the plate. On the other hand, there is a possibility to perform measurements with high resolution and reproducibility.

Figure 1:
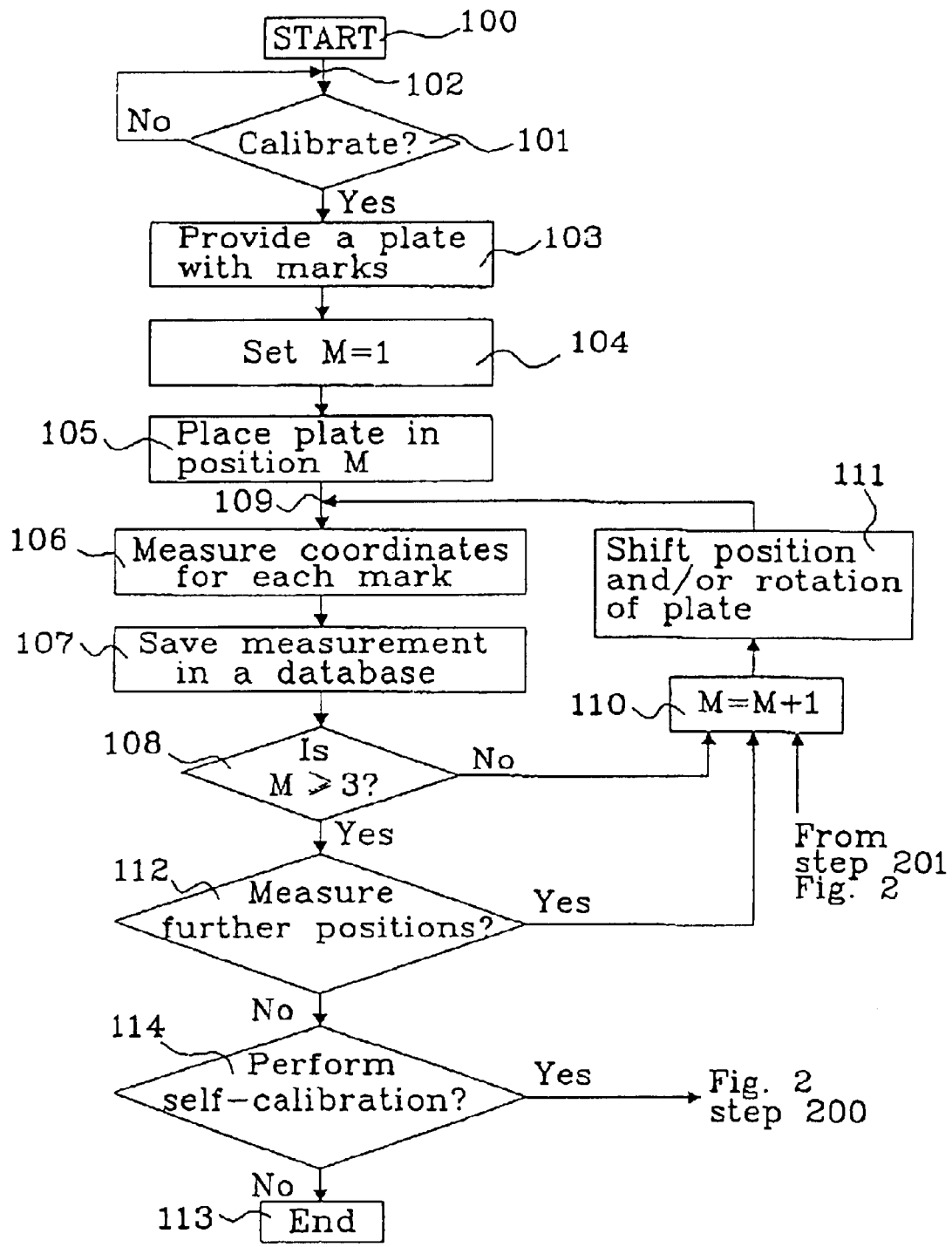
FIG. 1 shows a flow chart over the measurement procedure for collection of position data to perform self-calibration according to the invention.
Figure 2:
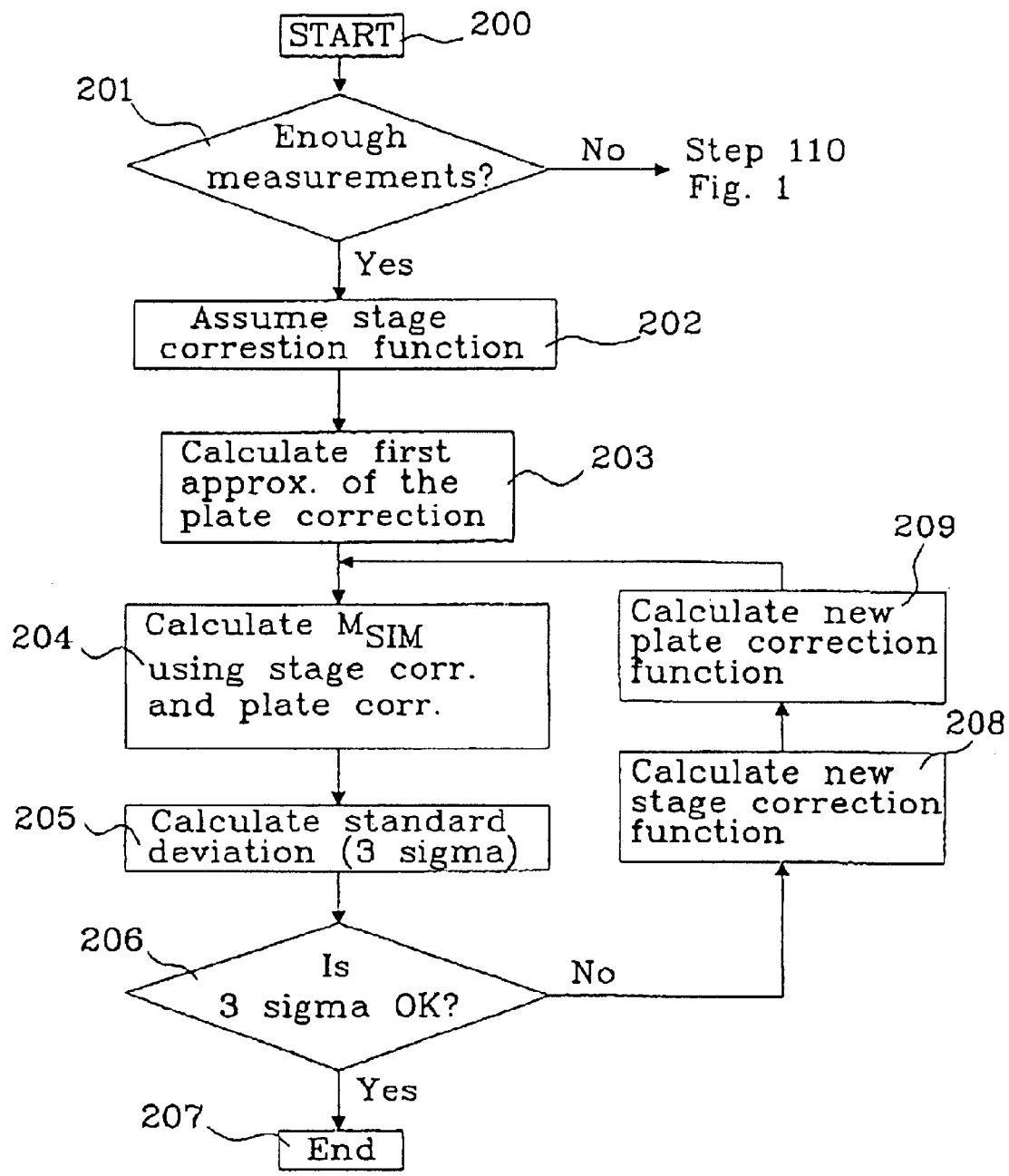
FIG. 2 shows a flow chart over the self-calibration procedure according to the invention using the measured position data.

FIG. 1 shows a flow chart for measuring the position of the marks on the plate in different measurement views for calibration purposes. The flow starts in step 100 and proceeds to step 101, where the flow is fed back to point 102 as long as the system waits for a decision to start gathering position data for a subsequent calibration procedure of the stage. The flow proceeds to step 103 when the gathering begins and a calibration plate provided with marks arbitrarily scattered across the surface. The number of marks is typically 400–500 for a plate having the size 800×800 mm. An integer M is set to a (M=1) in step 104, where M stands for the number of different measurement views. In the following step 105, the plate is placed in a first position (M=1) on the stage. The positions for each mark in at least the x and y direction is measured in step 106 and the result from the measurement is stored in a memory or database, step 107. In step 108 the value of M is checked, and if M<3 the flow is fed back to point 109 via step 110, where the value of M is increased by one (M=M+1), and step 111, where a new measurement view is determined including translation movement and rotational movement. Steps 105 to 108 are repeated until M≧3 and the flow continues to step 112, where it is possible to measure additional measurements views. If another measurement view is to be measured, the flow is fed back to point 109 via step 110 and step 111, as described before, and steps 104 to 108 are repeated again. The flow ends in step 113 if no more measurements are to be performed (step 114). If, on the other hand, the calibration procedure is to be performed, the flow proceeds to step 200 in FIG. 2.

Table 1 shows what facts are known and what facts are not known when measurements have been performed.

TABLE 1

| Known | Not known |
| --- | --- |
| The result of the measurements | The exact appearance of the plate<br>The stage correction function (distortion)<br>The placement coordinates for the plate for every measurement (x, y, α) |

If the facts were the other way around, and the only unknown fact was the result of the measurements, then it would have been rather easy to calculate them provided the exact position for all marks on the plate, the corrections that have to be applied to obtain a perfect coordinate system and the placement coordinates for the plate for different measurement views were known.

A numerical approach to the problem will result in an equation system that has to be solved having unknown:

2*N (the number of marks) on the plate, N is typically 400–500.

Approximately 2*N on the stage

3*M (the number of measurement views)

The known are 2*N*M, which means that there are more known than unknown provided at least three (3) measurements are performed. The equation system is uncomplicated, almost linear, rather thin (diagonal) and can be solved through a simple iterative method, which is described in connection with FIG. 2.

The flow starts in step 200, and in step 201, a check is made to determine if enough measurements of different measurement views was carried out in the steps described in FIG. 1. If the method decides that not enough measurement views have been measured to solve the equation system, the flow is fed back to point 109, in FIG. 1, via step 110 and 111. Steps 105 to 108 and 112 are repeated and the flow is returned to FIG. 2 from step 114.

When enough measurement views have been measured the flow continuous to step 202, the stage correction function $S_0(x,y,\alpha)$ is preferably set to zero for all positions, i.e. we assume the stage is perfect and no distortion function is present, since the actual distortion of the stage is very low. It is however possible to assume any other distortion function to the stage initially, the function of the actual distortion will converge but it may take a little longer time due to more calculations.

A plate approximation is calculated in the following step 203, from each measurement of position data N(x,y) for each measurement view M. That is, in this early stage of the calibration procedure, the measurement made in each measurement view is considered to be a description of the plate if the correction function is set to zero in step 202, otherwise each measurement have to be compensated by the stage correction function.

Thereafter, an average value for each measured position on the plate for all M descriptions is calculated, and is considered to be a first model of the plate—$P_1(x,y)$. This model of the plate is then used to estimate the position of the plate for each measurement, i.e. in each measurement view.

In step 204, simulated measurements $M_{SIM}$ are then calculated using the model of the plate $P_1(x,y)$ and the description of the stage $S_0(x,y,\alpha)$ which is zero for all positions. The calculations are performed by using pure geometries, and the deviations between the simulated measurements and the "real" measurements for each measurement view will generate a standard deviation value ($3\sigma$) describing the in step 205, which indicate how well the stage correction function compensates for the actual appearance of the stage.

In step 206, the standard deviation value—$3\sigma$ is compared with a predetermined value, and if $3\sigma$ is greater than the predetermined value (i.e. $3\sigma$ is not ok!) the flow will proceed to step 208, where a new description of the stage $S_1(x,y,\alpha)$ is calculated using deviations between the previously calculated simulated measurements $M_{SIM}$ (using the previous stage description $S_0(x,y,\alpha)$ and the model of the plate $P_1(x,y)$) and the actual measurements for each measurement view.

M new descriptions of the plate is thereafter calculated in step 209 using the new stage description $S_1(x,y,\alpha)$. The average value for the measured positions in all measurement views is thereafter calculated for each position and a new model of the plate $P_2$ is calculated. The flow is thereafter fed back to point 210 and steps 204–206 are repeated until the standard deviation $3\sigma$ is less than the predetermined value. The flow ends in step 207 and the latest calculated description of the stage determines the correction function that will be applied to the stage.

Figure 3:
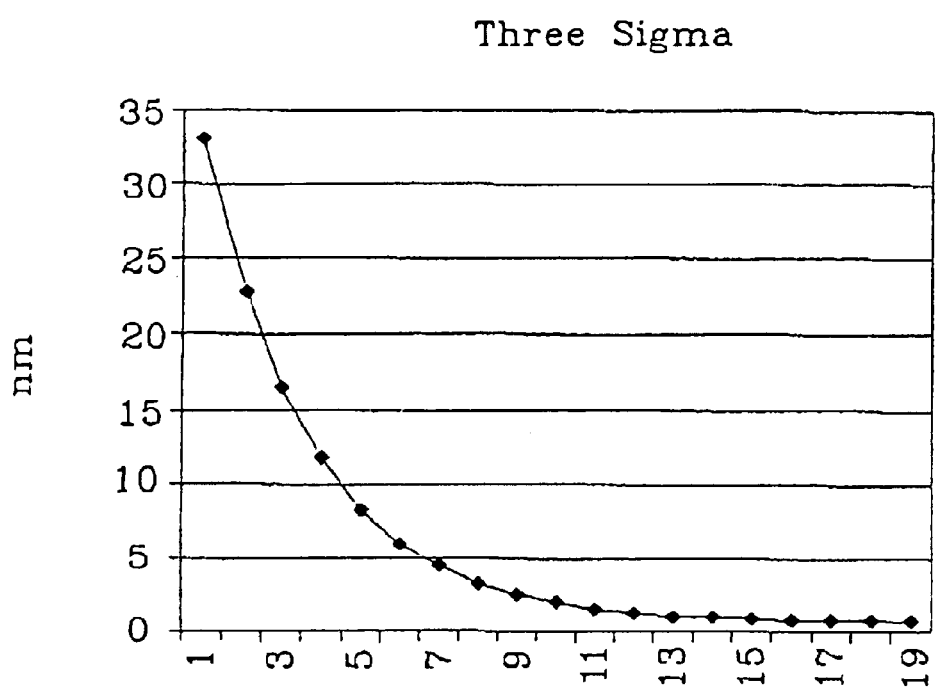
FIG. 3 illustrates an example of a standard deviation 3σ converging when performing the method according to the invention.

FIG. 3 illustrates an example of a standard deviation $3\sigma$ converging when performing the method previously described. The first assumption with the stage distortion being set to zero, result in a standard deviation of 33 nm, the stage correction function is calculated and a new plate correction function is calculate using the new stage correction function. A new deviation is calculated and the stage function is starting to converge, $3\sigma=23$ nm. The loop is repeated until $3\sigma$ is less than a predetermined value, e.g. 5 nm, which means that the method is completed after 7 repetitions. The method may also be completed when a certain number of repetitions have been performed, e.g. 10 repetitions, which will give a $3\sigma$ of approx 2 nm in this example.

This application is related to the concurrently filed U.S. application Ser. No. 10/692,863, filed Oct. 27, 2003. that names the same inventors, titled "A method for writing a pattern on a surface intended for use in exposure equipment and for measuring the physical properties of the surface" the entire contents of which are incorporated herein by reference.

When performing the self-calibration it could be advantageous to also compensate for the unevenness that exists in both the stage and the artefact plate, as disclosed in the above mentioned concurrently filed US Application.

Step 106 in the flow chart in FIG. 1 then has to be modified to include to also measure the height, i.e. the z coordinate for each mark. An additional step is inserted between step 106 and step 107, where the unevenness is compensated by calculating a local offset for the measured x and y position for each mark using a reference surface. The result is a 2-dimensional z-correction function that is applied to the measured x and y coordinates. Step 107 is thus modified to include the storing of corrected position data for each mark instead of just saving the measurement.

The working principal to obtain the z-correction function is to measure and/or calculate the gradient at the position of each mark.

The calculating means for performing the method is preferably implemented in a computer program that controls the measuring apparatus.

What is claimed is:

1. Method for calibrating a metrology stage in at least two dimensions using an artefact plate having marks forming a pattern, comprising the steps of:

placing the artefact plate on the metrology stage in at least three arbitrary positions, assuming the geometrical properties of the metrology stage and the artefact plate, and the positions of the artefact plate for each measurement, forming a model predicting the measurements of the artefact plate, measuring the marks by the metrology stage at the at least three aribitrary positions, and inverting said model to improve the assumptions on metrology stage and artefact plate.

2. The method according to claim 1, wherein the inverting is performed in a computer program.

3. The method according to claim 1, wherein an iterative method is used to calculate successive improvements of the model.

4. The method according to claim 1, wherein a linear equation system is calculated that approximates the problem to be solved.

5. A method for self calibration of a metrology stage comprising the steps of:

(a) providing an artefact plate having a number of marks scattered thereupon. which is arranged on the metrology stage, (b) measuring the position of the marks for at least three different measurement views of the plate, which measurement views are obtained using arbitrary translation and/or rotation of the plate, whereby one set of position data for the plate is obtained for each measurement view, (c) assuming a predetermined shape of the stage, whereby a 2-dimensional stage correction function is determined, (d) calculate a 2-dimensional plate correction function using the available measured sets of position data for the plate and the stage correction function, (e) calculate 2-dimensional simulated position data for each mark in all measurement views, (f) recalculate the 2-dimensional stage correction function from the difference between the simulated position data and the measured position data, (g) repeat step (d)–(f) until the simulated position data is acceptable compared to the measured position data.

6. The method according to claim 5, wherein the marks on the plate are arranged in a two-dimensional grid structure.

7. The method according to claim 5, wherein an average value for all measured position data is used when calculating the plate correction function in step (d).

8. The method according to claim 5, wherein the predetermined shape of the stage in step (c) is selected be a perfect shape, whereby a 2-dimensional stage correction function is zero across the stage.

9. The method according to claim 5, wherein the position data in step (b) is measured in 2 dimensions, whereby the plate is assumed to have a perfectly flat shape.

10. The method according to claim 5, wherein the position data in step (b) is measured in 3 dimensions, whereby a 2-dimensional set of position data for each measurement view may be calculated using a 2-dimensional z-correction function.

11. The method according to claim 10, wherein the z-correction function is determined using information regarding the gradient of the plate at each mark and the thickness of the plate.

12. The method according to claim 5, wherein the repetition in step (g) ends when the deviation of the difference between the simulated position data and the measured position data is below a predetermined value.

13. The method according to claim 5, wherein the repetition in step (g) ends when a certain number of repetitions of step (d)–(f) has been performed.

14. The method according to claim 1, wherein the marks are arbitrarily scattered across the surface of the artefact plate.

15. The method according to claim 5, wherein the marks on the plate are arbitrarily scattered across the surface of the artefact plate.

* * * * *